United States Patent [19]

Shibue

[11] Patent Number: 5,208,774
[45] Date of Patent: May 4, 1993

[54] SEMICONDUCTOR MEMORY DEVICE WITH LOW POWER CONSUMPTION OUTPUT DATA SELECTOR

[75] Inventor: Yasuo Shibue, Tokyo, Japan

[73] Assignee: NEC Corporation, Tokyo, Japan

[21] Appl. No.: 767,717

[22] Filed: Sep. 30, 1991

[30] Foreign Application Priority Data

Sep. 30, 1990 [JP] Japan ................................. 2-263668

[51] Int. Cl.$^5$ ........................................... G11C 13/00
[52] U.S. Cl. ......................... 365/189.08; 365/189.01; 365/227
[58] Field of Search ................... 365/182, 203, 189.01, 365/189.04, 189.08, 230.01, 226, 227

[56] References Cited

U.S. PATENT DOCUMENTS 4,953,127  8/1990  Nagahashi et al. ............ 365/189.05

Primary Examiner—Terrell W. Fears
Attorney, Agent, or Firm—Sughrue, Mion, Zinn, Macpeak & Seas

[57] ABSTRACT

A static random access memory device has read-out bit lines for propagating read-out data bits to a selector circuit, and logic gates are coupled between the read-out bit lines and the selector circuit for inverting the data bits, wherein through current tends to flow through the logic gates due to decayed voltage levels on the read-out bit lines; however, only one of the logic gate coupled with a transfer transistor selected by a column address decoder is enabled so as to decrease the amount of the through current.

7 Claims, 6 Drawing Sheets

SEMICONDUCTOR MEMORY DEVICE WITH LOW POWER CONSUMPTION OUTPUT DATA SELECTOR

FIELD OF THE INVENTION

This invention relates to a semiconductor memory device and, more particularly, to a low power consumption output data selector incorporated in, for example, a static type random access memory device.

DESCRIPTION OF THE RELATED ART

A typical example of the random access memory device is illustrated in FIG. 1 of the drawings, and the random access memory device comprises a memory cell array 1 implemented by a large number of memory cells M11,M12, M1n, M21, M22, M2n, Mm1, Mm2 and Mmn. The memory cell array 1 is associated with word lines WA1, WA2 and WAm, write-in bit line pairs WBP1, WBP2 and WBPn, read-out bit lines RBL1, RBL2 and RBLn and write enable lines WEL1, WEL2 and WELn. The word lines WA1 to WAm are selectively lifted to an active high voltage level approximately equal to a positive power voltage level Vdd, and a row of the memory cells M11 to M1n, M21 to M2n or Mm1 to Mmn coupled thereto become ready state. The write-in bit line pairs WBP1 to WBPn propagate a write-in data bit to the selected row of the memory cells, and the write-in data bit is represented by a write-in data signal and the complementary signal thereof. The write enable lines WEL1 to WELn are selectively lifted to an active high voltage level, and allows the input data bit to be written into one of the selected row of the memory cells M11 to M1n, M21 to M2n or Mm1 to Mmn. The read-out bit lines RBL1 to RBLn propagate read-out data bits from the selected row of the memory cells M11 to M1n, M21 to M2n or Mm1 to Mmn. Thus, the memory cell array 1 is controlled by the word lines WA1 to WAn and the write enable lines WEL1 to WELn, and is communicable with peripheral units through the write-in bit line pairs WBP1 to WBPn and the read-out bit lines RBL1 to RBLn.

The arrangement of each memory cell is illustrated in FIG. 2, and the associated write-in bit line pair, the associated read-out bit line, the write enable line and the associated word line are respectively labeled with WBP, RBL, WEL and WA. The memory cell comprises a flip-flop circuit 1a implemented by two inverting circuits, and the flip-flop circuit memorizes a write-in data bit supplied from the associated write-in bit line pair WBP. The fip-flop circuit 1a is connectable with the associated write-in bit line pair WBP through a first pair of transfer transistors 1b and 1c as well as a second pair of transfer transistors 1d and 1e, and all of the transfer transistors 1b to 1e are of the n-channel enhancement type field effect transistor. The first pair of transfer transistors 1b and 1c are gated by the associated word line WA, and the second pair of transfer transistors 1d and 1e are gated by the associated write enable line WEL. The flip-flop circuit 1a is further coupled through a series combination of an inverting circuit 1f and a transfer transistor 1g with the associated read-out bit line RBL, and the transfer transistor 1g is implemented by an n-channel enhancement type field effect transistor gated by the associated word line WA. When the associated word line WA is lifted to the active high voltage level, the first pair of transfer transistors 1b and 1c and the transfer transistor 1g concurrently turn on, and enter the ready state. In the ready state, the data bit stored in the memory cell is read out through the series combination of the inverting circuit 1f and the transfer transistor 1g to the associated read-out bit line RBL. However, the associated write-in bit line pair WBP has not been coupled with the memory cell yet. If the associated write enable line WEL is lifted to the active high voltage level, the second pair of transfer transistors 1d and 1e concurrently turn on, and the write-in signal and the complementary write-in signal reach the flip-flop circuit 1a. Then, the write-in data bit is memorized in the memory cell.

Turning back to FIG. 1 of the drawings, the memory cell array 1 is associated with various peripheral units, and the peripheral units include a row address decoding unit 2, a column address decoding unit 3, a write enable buffer unit 4, a write-in data buffer unit 5, transfer transistors 6a associated with inverting circuits 7, a write enable input buffer unit 8, an input data buffer unit 9, and an output data buffer unit 10. The inverting circuits and the transfer transistors 6aas a whole constitute a read-out selecting unit 6. The row address decoding unit 2 is responsive to row address bits, and selectively lifts one of the word lines WA1 to WAm. The column address decoding unit 3 is responsive to column address bits, and shifts one of the decoded signal lines SL1, SL2 and SLn to an active level. Since the decoded signal lines SL1 to SLn are coupled with not only the write-enable buffer unit 4 but also the read-out data selecting unit 6, a write enable signal WE is transferred from the write enable input buffer 8 to one of the write enable signal lines WEL1 to WELn, and one of the read-out data bits is relayed from the associated inverting circuit 7 to the output data buffer unit 10. Each of the inverting circuits 7 is implemented by a series combination of a p-channel enhancement type field effect transistor 7a and an n-channel enhancement type field effect transistor 7b coupled between a positive power voltage line Vdd and a ground voltage line GND, and the gate electrodes of the field effect transistors 7a and 7b are coupled with the associated read-out bit line RBL as shown in FIG. 3. The output data buffer unit 10 produces an output data signal Dout indicative of the read-out data bit, and supplies the output data signal Dout to the outside thereof. On the other hand, an input data buffer unit 9 keeps an input data signal Din, and distributes the input data signal Din to the write-in data buffer unit 5 as the write-in data bit. The write-in data buffer unit 5 produces the write-in data signal and the complementary signal thereof, and supplies them to the write-in bit line pairs WBP1 to WBPn. However, only one of the memory cells in the ready state is enabled by the selected write enable signal line WEL1 to WELn, and the write-in data bit is memorized therein.

In operation, the random access memory device selectively enters a write-in phase and a read-out phase depending upon the write enable signal WE. It is assumed that the row and column address bits are indicative of the memory cell M11. In the write-in phase, the row address decoding unit 2 lifts the word WA1 to the active high voltage level, and the column address decoding unit 3 allows the write enable buffer unit 4 to transfer the write enable signal WA1 causes the first pair of transfer transistors 1b and 1c as well as the transfer transistor 1g to turn on. A data bit memorized in the memory cell M11 is read out through the read-out bit line RBL1, the inverting circuit 7 and the read-out data selecting unit 6 to the output data buffer unit 10, however, any output data buffer unit 10 remains inactive. An input data signal Din is transferred from the input data buffer unit 9 to the write-in data buffer unit 5, and the write-in data signal and the complementary signal thereof are supplied to all of the write-in bit line pairs WBP1 to WBPn. Since only the write enable line WE1 is lifted to the active high voltage level, the second pair of transfer transistor 1d and 1e of the memory cell M11 turn on, and the write-in data bit indicated by the write-in data signal and the complementary signal is memorized in the flip flop circuit 1a of the memory cell M11.

In the read-out phase, the row address decoding unit 2 similarly lifts the word line WA1 to the active high voltage level, and transfer transistor 1g turns on. Since the write enable signal WE is not supplied to the random access memory device, any write enable signal line WEL is not lifted to the active high voltage level, and all the second pairs of transfer transistors 1d and 1e remain off so as to isolate the flip flop circuits 1a from the associated write-in bit lines pairs WBP1 to WBPn. While the transfer transistors 1g are turned on, the data bits are inverted by the associated inverting circuits 1f, and are transferred to the associated read-out bit lines RBL1 to RBLn, respectively. The read-out data bits are inverted by the associated inverting circuits 7 again, and the column address decoding unit 3 allows the read-out data selecting unit 6 to transfer the read-out data buffer unit 10. Then, the output data signal Dout is indicative of the read-out data bit read out from the memory cell M11.

A problem is encountered in the prior art random access memory device in current consumption. In detail, the inverting circuits 1f supply the read-out data bits each indicated by the positive high voltage level Vdd or the ground voltage level to the transfer transistor 1g. If the read-out data bit is indicated by the positive high voltage level Vdd, the positive high voltage level indicative of the read-out data bit is slightly lowered by the transfer transistor 1g due to the threshold level. The read-out bit line propagates the lowered positive voltage level to the gate electrodes of the field effect transistors 7a and 7b forming in combination of the associated inverting circuit 7. The lowered positive voltage level allows the n-channel enhancement type field effect transistor 7b to turn on. However, the lowered positive voltage level hardly causes the p-channel enhancement type field effect transistor 7a to perfectly turn off. In other words, the p-channel enhancement type field effect transistor 7a is still conductive, and through-current flows from the positive power voltage line Vdd through the inverting circuit 7 to the ground voltage line GND. As described hereinbefore, the read-out data bits reach the inverting circuits 7 regardless of the phase of operation, and the inverting circuits 7 supplied with the lowered positive voltage level allow through-current to pass therethrough. The through-current deteriorates the current consumption of the random access memory device. If the memory cell array 1 is enlarged, the number of columns and, accordingly, the number of inverting circuits 7 are increased, and the through-current becomes serious.

SUMMARY OF THE INVENTION

It is therefore an important object of the present invention to provide a semiconductor memory device the current consumption of which is decreased.

To accomplish the object, the present invention proposes to enable only one of logic gates associated with a selected read-out bit line to be responsive to a read-out data bit.

In accordance with the present invention, there is provided a random access memory device fabricated on a single semiconductor chip and having at least a read-out phase of operation, comprising: a) a plurality of word lines selectively shifted to an active level depending upon row address bits; b) a plurality of read-out bit lines; c) a plurality of memory cells arranged in rows and columns, and associated with the plurality of word lines and with the plurality of read-out bit lines, each of the plurality of memory cells having a data storage circuit for storing a data bit, an inverting circuit for producing the complementary bit of the data bit, and a first field effect transistor coupled between first and second sources of voltage level and gated by the associated word line for transferring the complementary bit to the associated read-out bit line; and d) selecting means having a plurality of logic circuits coupled between the first and second sources of voltage level and operative to retrieve the data bits from the complementary bits on the read-out bit lines, respectively, and a plurality of second field effect transistors coupled between the plurality of logic circuits and an output data circuit and selectively turning on depending upon column address bits, the plurality of logic circuits being further operative to block output nodes thereof from one of the first and second sources of voltage level except for at least one of the logic gates associated with at least one of the second field effect transistors in on-state in a read-out phase of operation.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
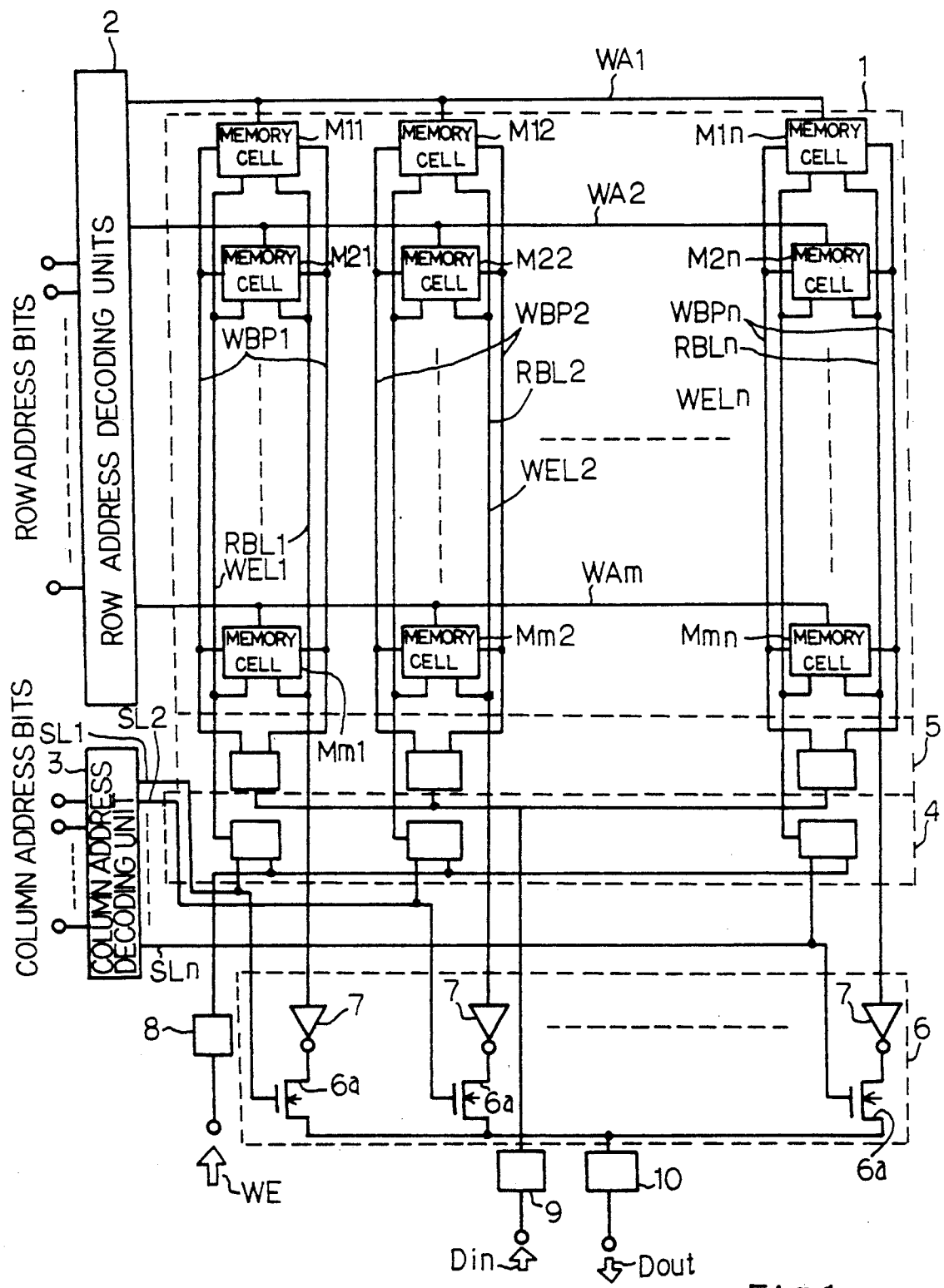
FIG. 1 is a block diagram showing the arrangement of the prior art static type random access memory device.
Figure 2:
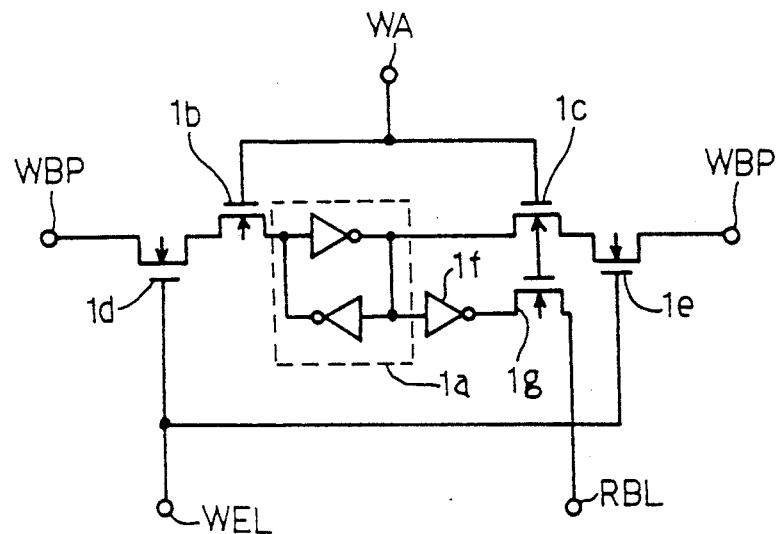
FIG. 2 is a circuit diagram showing the arrangement of a memory cell incorporated in the prior art static type random access memory device.
Figure 3:
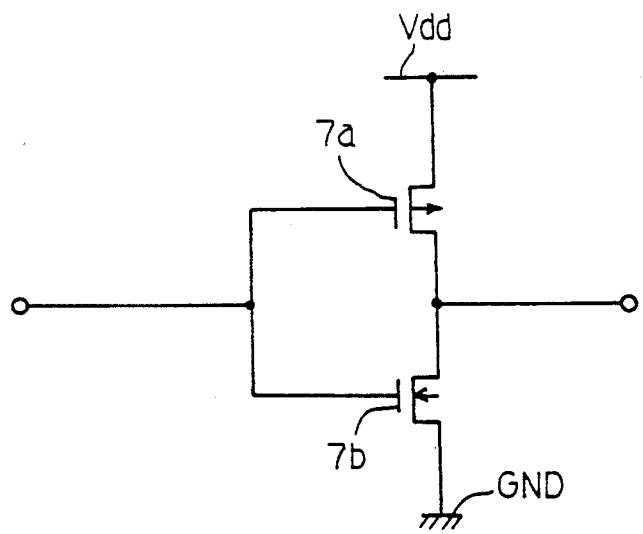
FIG. 3 is a circuit diagram showing the arrangement of an inverting circuit incorporated in the prior art static type random access memory device.
Figure 4:
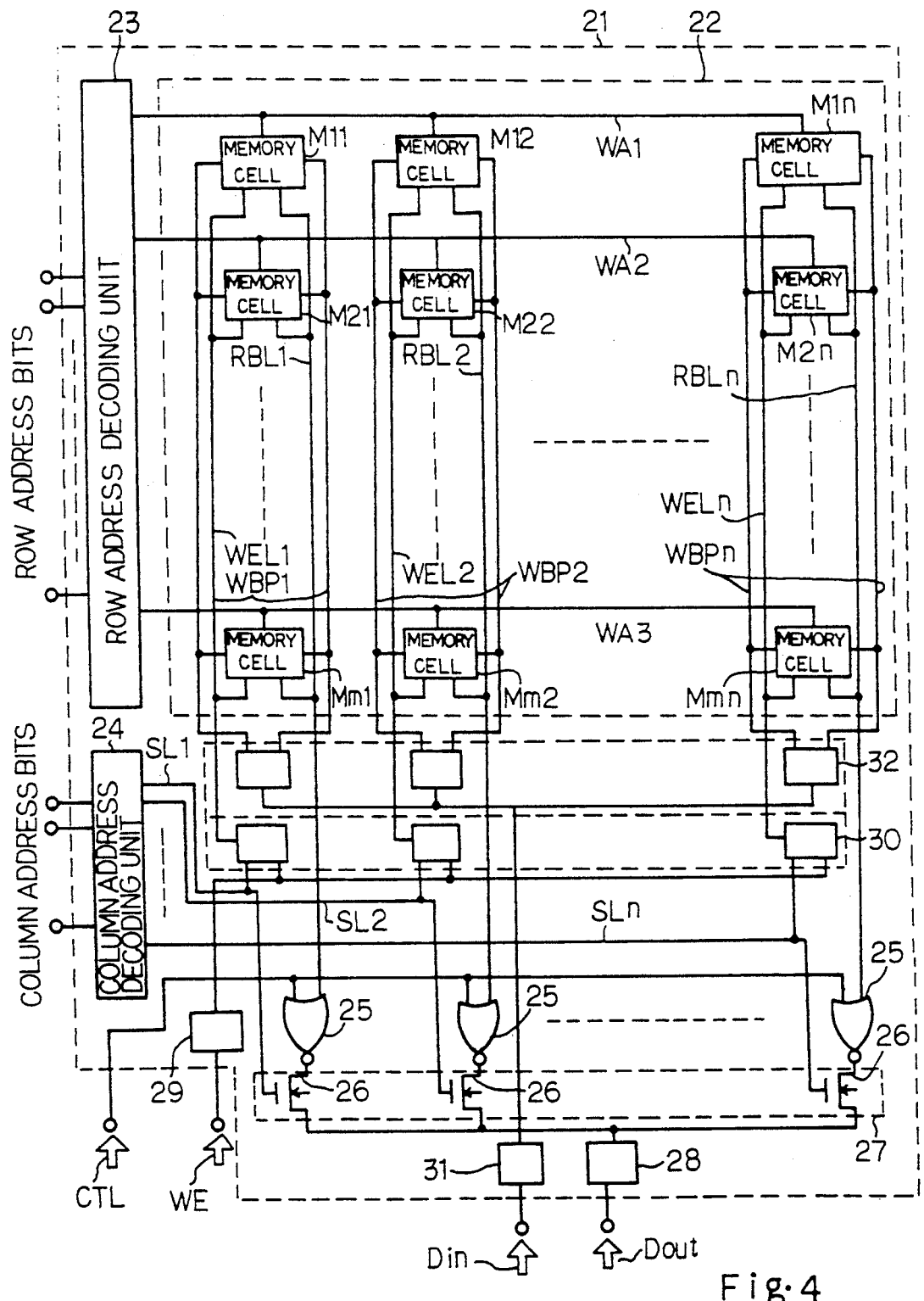
FIG. 4 is a block diagram showing the arrangement of a static type random access memory device according to the present invention.
Figure 5:
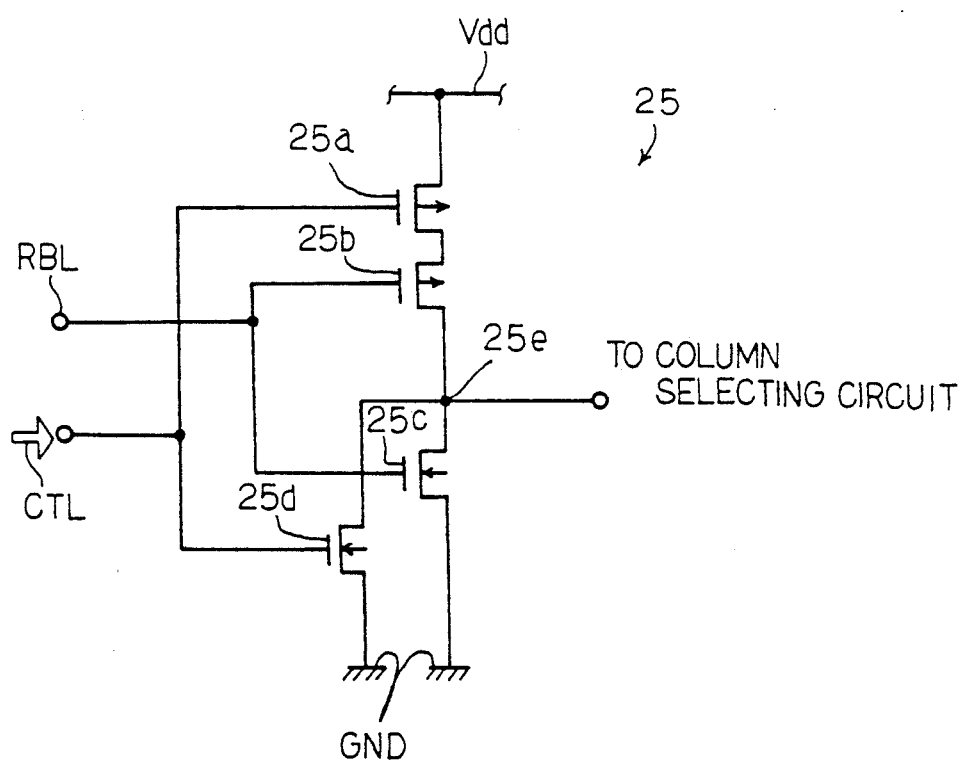
FIG. 5 is a circuit diagram showing the arrangement of a NOR gate incorporated in the static type random access memory device shown in FIG. 3.

Referring to FIG. 4 of the drawings, a static type random access memory device embodying the present invention is fabricated on a single semiconductor chip 21, and the static type random access memory device selectively enters a write-in phase, a read-out phase and a stand-by phase of operation. The static type random access memory device largely comprises a memory cell array 22 and peripheral units. The memory cell array 22 is implemented by a plurality of memory cells M11 to Mmn arranged in rows and columns, and the memory cells M11 to Mmn have the circuit arrangement illustrated in FIG. 2. For this reason, no further description on the memory cells M11 to Mmn is incorporated hereinbelow.

The peripheral units include a row address decoding unit 23 responsive to row address bits for selectively lifting word lines WA1 to WAm to an active high voltage level as high as a positive power voltage level Vdd, and a column address decoding unit 24 decodes a digital code represented by column address bits for selectively driving decoded signal lines SL1 to SLn. When one of the word lines WA1 to WAm goes up to the active high voltage level, a row of the memory cells enter ready state. A plurality of write-in bit line pairs WBP1 to WBPn are respectively associated with the columns of the memory cells M11 to Mmn, and propagate a write-in data bit represented by a write-in data signal and the complementary signal thereof. The columns of the memory cells M11 to Mmn are further associated with write-in enable lines WEL1 to WELn, and the write-in enable lines WEL1 to WELn are selectively lifted to the active high voltage level for selecting a memory cells from the row of the memory cells coupled with the selected word line. Read-out bit lines RBL1 to RBLn are respectively coupled with the columns of the memory cells M11 to Mmn, and respectively propagate read-out data bits from the row of memory cells coupled with the selected word line to NOR gates 25.

As will be seen from FIG. 4, each of the NOR gates 25 comprises a series combination of p-channel enhancement type field effect transistors 25a and 25b and an n-channel enhancement type field effect transistor 5c coupled between a positive power voltage line Vdd and a ground voltage line GND, and an n-channel enhancement type field effect transistor 25d coupled between an output node 25e and the ground voltage line GND. The p-channel enhancement type field effect transistor 25b and the n-channel enhancement type field effect transistor 25c are gated by the associated read-out bit line RBL, and a control signal CTL is supplied to the gate electrodes of the p-channel enhancement type field effect transistor 25a and the n-channel enhancement type field effect transistor 25d. In this instance, the control signal CTL goes up to the active high voltage level as high as the power voltage level in the stand-by phase and the write-in phase of operation, and all of the NOR gates 25 perfectly block the output nodes 25e from the positive power voltage line Vdd. However, the control signal CTL remains low in the read-out phase of operation. The output nodes 25e of the NOR gates 25 are respectively coupled with n-channel enhancement type field effect transistors 26 which form in combination a column selecting circuit 27. The decoded signal lines SL1 to SLn are respectively coupled with the gate electrodes of the n-channel enhancement type field effect transistors 26, and one of the output nodes 25e is coupled through the column selecting circuit 27 with an output data buffer unit 28 in the read-out phase of operation. However, non-selected n-channel enhancement type field effect transistors 26 keep off in the write-in phase of operation. In this instance, the NOR gates 25 and the column selecting circuit 27 as a whole constitute selecting means.

A write enable signal WE is supplied to a write enable buffer unit 29 which in turn relays the write enable signal WE to a driving unit 30, and the driving unit 30 is responsive to the decoded signals on the signal lines SL1 to SLn for lifting one of the write enable signal lines WEL1 to WELn to the active high voltage level in the write-in phase of operation. However, all of the write enable signal lines WEL1 to WELn remain low in the read-out phase of operation. An input data bit Din is supplied to an input data buffer unit 31 which supplies the input data bit Din to the write-in data buffer unit 32 as a write-in data bit. The write-in data buffer unit 32 produces the write-in data signal and the complementary signal thereof, and supplies these signals to all of the write-in bit line pairs WBP1 to WBPn.

The static type random access memory device thus arranged selectively enters the write-in phase and the read-out phase of operation depending upon the write enable signal WE. However, if no memory cell is accessed, the static type random access memory device remains in the stand-by phase. Logic "1" and "0" levels are assumed to be the positive high voltage level and the low or ground voltage level in the following description. In the read-out phase of operation, the control signal CTL remains low, and the NOR gates 25 are enabled with the control signal CTL of logic "0" level. Upon being enabled, the NOR gates 25 are responsive to the read-out data bits on the read-out bit lines RBL1 to RBLn, and serve as inverting circuits. For this reason, the circuit behavior of the static type random access memory device implementing the first embodiment is similar to that of the prior art random access memory device, and no further description is incorporated hereinbelow.

If the control signal CTL goes up to the positive high voltage level, all of the NOR gates 25 yield logic "0" level at the output nodes 25e. Namely, the control signal CTL allows the n-channel enhancement type field effect transistor 25d of each NOR gate 25 to turn on for conducting the output node 25e to the ground voltage line GND. However, the p-channel enhancement type field effect transistor 25a perfectly turns off, because the control signal CTL is as high as the positive power voltage level Vdd. As described hereinbefore, the read-out bit lines RBL1 to RBLn are lower than the positive power voltage level Vdd even if the complementary read-out data bits are logic "1" level, because the positive high voltage level is decayed by the n-channel enhancement type field effect transistor 1g. With the lowered positive voltage level, the p-channel enhancement type field effect transistors 25b may not be perfectly turned off. However, the p-channel enhancement type field effect transistors 25a isolate the output nodes 25e from the positive power voltage line Vdd, and no through-current flows through the NOR gates 25. In the stand-by phase, all of the word lines WA1 to WAm remain low, and the n-channel enhancement type field effect transistors 1g are turned off. Therefore, the read-out bit lines RBL1 to RBLn keep voltage levels in the previous read-out or write-in phase. In other words, some of the read-out bit lines RBL1 to RBLn are in the lowered voltage level. However, the control signal CTL is in the active high voltage level, and no through-current flows through the NOR gates 25. This results in improvement of power consumption.

In the first embodiment, the control signal CTL is supplied from the outside. However, the control signal CTL may be internally produced.

Second Embodiment

Figure 6:
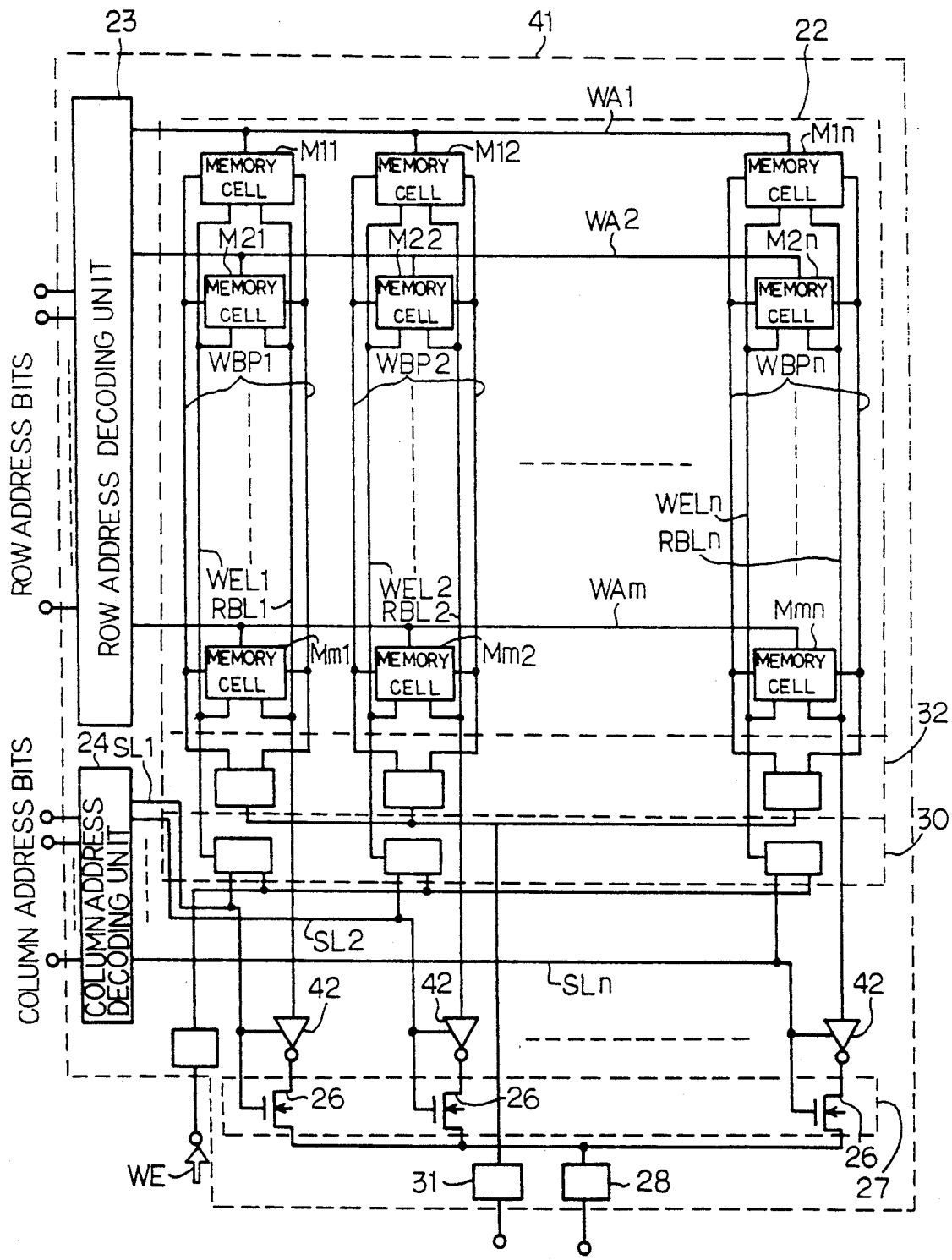
FIG. 6 is a block diagram showing the arrangement of another static type random access memory device according to the present invention.

Turning to FIG. 6 of the drawings, another static type random access memory device embodying the present invention is also fabricated on a single semiconductor chip 41. The static type random access memory device implementing the second embodiment is similar in circuit arrangement to the first embodiment except for logic circuits, and, for this reason, component units except for the logic circuits are labeled with the same references designating the corresponding units of the first embodiment without any detailed description.

Figure 7:
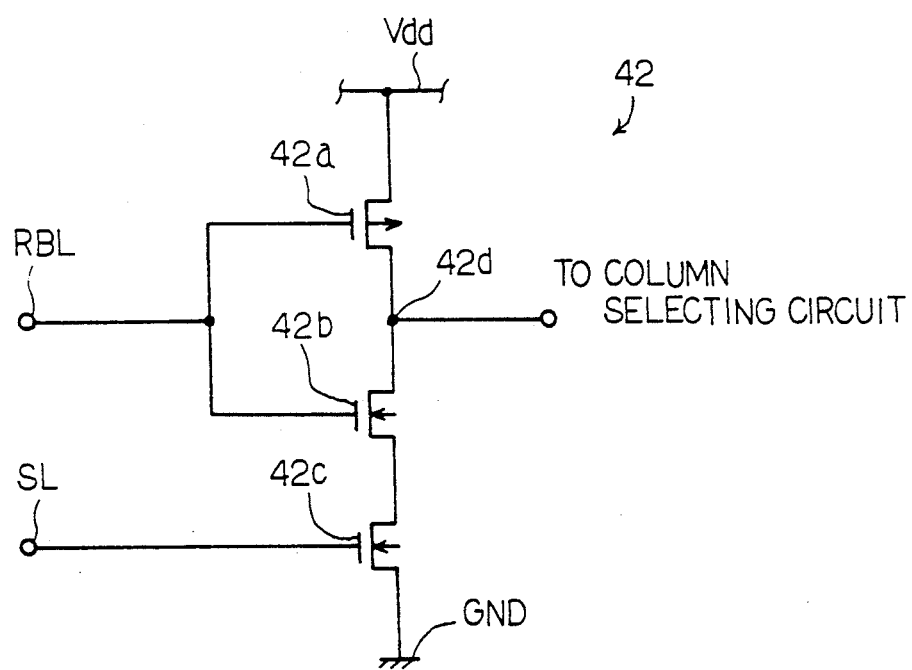
FIG. 7 is a circuit diagram showing the arrangement of an inverting circuit with a power saving mode incorporated in the random access memory device shown in FIG. 6.

The logic circuits are implemented by an inverting circuits 42, and each of the inverting circuits 42 comprises a series combination of a p-channel enhancement type field effect transistor 42a and two n-channel enhancement type field effect transistors 42b and 42c coupled between the positive power voltage line Vdd and the ground voltage line GND as shown in FIG. 7. The output node 42d is provided between the p-channel enhancement type field effect transistor 42a and the n-channel enhancement type field effect transistor 42b, and is coupled with the column selecting circuit 27. The associated read-out bit line RBL is coupled with the gate electrodes of the p-channel enhancement type field effect transistor 42a and the n-channel enhancement type field effect transistor 42b, and the n-channel enhancement type field effect transistor 42c is gated by the associated decoded signal line SL.

The static type random access memory device thus arranged selectively enters a read-out phase, a write-in phase and a stand-by phase of operation. While the static type random access memory device is in the stand-by phase, all of the decoded signal lines SL1 to SLn remain in the ground voltage level, and all of the n-channel enhancement type field effect transistors 42c are turned off. No through-current flows through the inverting circuits 42.

In following description, the memory cell M11 is assumed to be designated by the row and column address bits. If the write enable signal WE goes up to the active high voltage level, the static type random access memory device enters the write-in phase, and the word line WA1 goes up to the active high voltage level. The memory cells M11 to M1n enter the ready state, and the data bits are read out through the n-channel enhancement type field effect transistors 1g to the associated read-out bit lines RBL1 to RBLn, respectively. The decoded signal line SL1 is lifted to the active high voltage level, and the write enable signal line WEL1 goes up to the active high voltage level. Then, the flip flop circuit 1a is conducted to the associated write-in bit line pair WBP1, and an input data bit or a write-in data bit thereon is memorized in the memory cell M11. The other decoded signal lines SL2 to SLn remain in the ground voltage level, and the n-channel enhancement type field effect transistors 42c are turned off. For this reason, no through-current flows through the inverting circuits 42 coupled with the other decoded signal lines SL2 to SLn. Since the decoded signal line SL1 allows the n-channel enhancement type field effect transistor 42c to turn on, a current path may be established through the inverting circuit 42 depending upon the voltage level on the associated read-out bit line RBL. However, the through current is negligible, and hardly deteriorates the current consumption.

If the write-in enable signal remains the inactive ground voltage level, no write-in enable signal line is lifted to the active high voltage level, and the memory cells M11 to M1n are never conducted to the associated write-in bit line pairs WBP1 to WBPn. However, the data bits are read out from the flip flop circuits 1a of the memory cells M11 to M1n, and the inverting circuits 1f produce the complementary data bits. If the complementary data bit is logic "0" level, the associated read-out bit line goes down to the ground voltage level. However, the complementary data bit of logic "1" level produces a positive voltage level slightly lower than the positive power voltage level Vdd due to the threshold level of the n-channel enhancement type field effect transistor 1g. The ground voltage level and/or the lowered voltage level is propagated to the associated inverting circuits 42. Only the decoded signal line SL1 goes up to the active high voltage level, and the other decoded signal lines SL2 to SLn remain in the ground voltage level. For this reason, the inverting circuit 42 coupled with the read-out bit line RBL1 is enabled, and retrieves the data bit from the complementary data bit. One of the n-channel enhancement type field effect transistors 26 coupled with the decoded signal line SL1 turns on to transfer the voltage level at the output node 42d to the output data buffer unit 28. However, the other decoded signal lines SL2 to SLn remain in the ground voltage level, and causes the n-channel enhancement type field effect transistors 42c to turn off. No through current flows through the inverting circuits 42 thus disenabled, and the current consumption is improved.

As will be appreciated from the foregoing description, the static type random access memory device according to the present invention can be prevented from through current, and the power consumption is drastically improved.

Although particular embodiments of the present invention have been shown and described, it will be obvious to those skilled in the art that various changes and modifications may be made without departing from the spirit and scope of the present invention. For example, another logic gate or a three-state logic gate may be used for the logic gates.

What is claimed is:

1. A random access memory device fabricated on a single semiconductor chip and having at least a read-out phase of operation, comprising:

a) a plurality of word lines selectively shifted to an active level depending upon row address bits;

b) a plurality of read-out bit lines;

c) a plurality of memory cells arranged in rows and columns, and associated with said plurality of word lines and with said plurality of read-out bit lines, each of said plurality of memory cells having a data storage circuit for storing a data bit, an inverting circuit for producing the complementary bit of said data bit, and a first field effect transistor coupled between first and second sources of voltage level and gated by said associated word line for transferring said complementary bit to said associated read-out bit line; and d) selecting means having a plurality of logic circuits coupled between said first and second sources of voltage level and operative to retrieve said data bits from said complementary bits on said read-out bit lines, respectively, and a plurality of second field effect transistors coupled between said plurality of logic circuits and an output data circuit and selectively turning on depending upon column address bits, said plurality of logic circuits being further operative to block output nodes thereof from one of said first and second sources of voltage level except for at least one of said logic gates associated with at least one of the second field effect transistors in on-state in a read-out phase of operation.

2. A random access memory device as set forth in claim 1, in which said plurality of memory cells are of a static type.

3. A random access memory device as set forth in claim 2, in which said logic gates are implemented by two-input NOR, first input nodes of said NOR gates being supplied with a control signal enabling said NOR gates in said read-out phase of operation, said control signal disenabling said NOR gates in at least a stand-by phase, second input nodes of said NOR gates being coupled with said read-out bit lines, respectively.

4. A random access memory device as set forth in claim 2, in which said logic gates comprise complementary inverting circuits coupled with said first source of power voltage level and controlled by said read-out bit lines, respectively, and third field effect transistors coupled between said associated complementary inverting circuits and said second source of power voltage level and selectively shifted between on-state and off-state depending upon said column address bits.

5. A random access memory device fabricated on a single semiconductor chip and having at least a write-in phase and a read-out phase of operation, comprising:

a) a plurality of word lines one of which is shifted to an active level on the basis of row address bits;
b) a plurality of write-in bit line pairs;
c) a plurality of read-out bit lines;
d) a plurality of write enable signal lines;
e) a plurality of memory cells arranged in rows and columns, the rows of said plurality of word lines being respectively associated with said word lines, the columns of said plurality of memory cells being associated with said plurality of read-out bit lines, said plurality of write-in bit line pairs and said plurality of write enable signal lines, each of said plurality of memory cells having a flip flop circuit having a pair of memory nodes for memorizing a data bit in the form of a difference in voltage level, a first pair of transfer transistors respectively coupled with said pair of memory nodes and gated by the associated word line, a second pair of transfer transistors coupled between said first pair of transfer transistors and the associated write-in bit line pair and gated by the associated write enable signal line, a first inverting circuit coupled at the input node thereof with one of said pair of memory nodes for producing the complementary bit of said data bit memorized in said flip flop circuit, and a first transistor coupled between said first inverting circuit and the associated read-out bit line and gated by said associated word line;

f) NOR gates having first input nodes respectively coupled to said plurality of read-out bit lines, and second input nodes supplied with a control signal shifted to an active low level in said read-out phase, said control signal being shifted to an inactive high level in said write-in phase; and g) a column selecting circuit having a plurality of second transistors coupled between the associated output nodes of said NOR gates and an output data unit and selectively shifted between on-state and off-state depending upon column address bits.

6. A random access memory device fabricated on a single semiconductor chip and having at least a write-in phase and a read-out phase of operation, comprising:

a) a plurality of word lines one of which is shifted to an active level on the basis of row address bits;
b) a plurality of write-in bit line pairs;
c) a plurality of read-out bit lines;
d) a plurality of write enable signal lines;
e) a plurality of memory cells arranged in rows and columns, the rows of said plurality of word lines being respectively associated with said word lines, the columns of said plurality of memory cells being associated with said plurality of read-out bit lines, said plurality of write-in bit line pairs and said plurality of write enable signal lines, each of said plurality of memory cells having a flip flop circuit having a pair of memory nodes for memorizing a data bit in the form of a difference in voltage level, a first pair of transfer transistors respectively coupled with said pair of memory nodes and gated by the associated word line, a second pair of transfer transistors coupled between said first pair of transfer transistors and the associated write-in bit line pair and gated by the associated write enable signal line, a first inverting circuit coupled at the input node thereof with one of said pair of memory nodes for producing the complementary bit of said data bit memorized in said flip flop circuit, and a first transistor coupled between said first inverting circuit and the associated read-out bit line and gated by said associated word line;

f) a plurality of series combinations of complementary inverting circuits and third transistors each coupled between first and second sources of power voltage levels, said complementary inverting circuits being controlled by said read-out bit lines, respectively, said third transistors selectively shifted between on-state and off-state depending upon column address bits; and g) a column selecting circuit having a plurality of fourth transistors coupled between the associated output nodes of said complementary inverting circuits and an output data unit, each of said fourth transistors being selectively shifted to the same state as the associated third transistor depending upon said column address bits.

7. A random access memory device as set forth in claim 2, in which said logic gates comprise complementary inverting circuits coupled with said first source of power voltage level and controlled by said read-out bit lines, respectively, and third field effect transistors coupled between said associated complementary inverting circuits and said second source of power voltage level and selectively shifted between on-state and off-state depending upon said column address bits.

* * * * *